(12) United States Patent
Tatsukawa et al.

(10) Patent No.: US 7,153,009 B2
(45) Date of Patent: Dec. 26, 2006

(54) VEHICULAR HEADLAMP

(75) Inventors: Masashi Tatsukawa, Shizuoka-ken (JP); Hiroyuki Ishida, Shizuoka-ken (JP); Kiyoshi Sazuka, Shizuoka-ken (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 74 days.

(21) Appl. No.: 10/775,276

(22) Filed: Feb. 10, 2004

(65) Prior Publication Data
US 2004/0160772 A1 Aug. 19, 2004

(30) Foreign Application Priority Data
Feb. 13, 2003 (JP) ............................. 2003-035254

(51) Int. Cl.
*B60Q 1/00* (2006.01)
(52) U.S. Cl. ...................... 362/507; 362/240; 362/335; 362/351; 362/543
(58) Field of Classification Search ............... 362/507, 362/540–545, 549, 538, 539, 240, 241, 244, 362/245, 247, 335, 351, 800
See application file for complete search history.

(56) References Cited

U.S. PATENT DOCUMENTS

| 5,032,960 A | * | 7/1991 | Katoh .................. 362/240 |
| 5,170,220 A | * | 12/1992 | Matsumoto et al. ........ 356/121 |
| 6,411,022 B1 | | 6/2002 | Machida |
| 2001/0019486 A1 | | 9/2001 | Thominet |
| 2002/0196639 A1 | | 12/2002 | Weidel |
| 2003/0007344 A1 | | 1/2003 | Parker |

FOREIGN PATENT DOCUMENTS

| EP | 1 270 325 A3 | 1/2003 |
| JP | 6-89601 | 3/1994 |
| JP | 6-151973 | 5/1994 |
| JP | 11-232912 | 8/1999 |
| JP | 2001-266620 | 9/2001 |
| JP | 2003-31007 | 1/2003 |
| JP | 2003-310011 | 11/2003 |
| KR | 2001-0064820 | 7/2001 |

OTHER PUBLICATIONS

Patent Abstracts of Japan, Publication No. 06-089601, Publication Date: Mar. 29, 1994, 1 page.
Patent Abstracts of Japan, Publication No. 2001-266620, Publication Date: Sep. 29, 2001, 1 page.
Korean Office Action for KR Appl. No. 10-2004-0008910 mailed on Aug. 26, 2005, 3 pages.
Patent Abstracts of Japan, Publication No. 06-151973, Publication Date May 31, 1994, 2 pages.
Patent Abstracts of Japan, Publication No. 11-232912, Publication date Aug. 27, 1999, 2 pages.
Patent Abstracts of Japan, Publication No. 2001-177156, Publication Date Jun. 29, 2001, 2 pages.

(Continued)

*Primary Examiner*—Sandra O'Shea
*Assistant Examiner*—Mark Tsidulko
(74) *Attorney, Agent, or Firm*—Osha Liang L.L.P.

(57) ABSTRACT

A vehicular headlamp for emitting light toward a predetermined emitting direction includes: a plurality of semiconductor light emitting devices that are substantially aligned by aligning with their one sides with a predetermined straight line; and an optical component, having an optical center on the predetermined straight line, for irradiating light emitted by the semiconductor light emitting devices toward the predetermined emitting direction.

3 Claims, 13 Drawing Sheets

OTHER PUBLICATIONS

European Search Report for EP 04 00 3011 mailed on Aug. 10, 2005, 5 pages.
Patent Abstracts of Japan, Publication No. 2003-031007, Publication date: Jan. 31, 2003, 2 pages.
Chinese Office Action issued for Chinese application No. 2004100326182 dated Jan. 6, 2006, 3 pages.

* cited by examiner

VEHICULAR HEADLAMP

This patent application claims priority from a Japanese patent application No. 2003-035254 filed on Feb. 13, 2003, the contents of which are incorporated herein by reference.

BACKGROUND OF THE INVENTION

1. Field of the Invention

The present invention relates to a vehicular headlamp. More particularly, the present invention relates to a vehicular headlamp for emitting light toward a predetermined emitting direction.

2. Description of the Related Art

A vehicular headlamp including, for example, regular headlamp, fog lamp and cornering lamp for automobiles, trains, motorcycles or the like is used to emit light ahead of an automobile and has to distribute the emitted light in a desired distribution pattern with high precision from safety reasons. That light distribution pattern is formed by means of an optical system using a reflecting mirror, a lens or the like, as disclosed, for example in Japanese Patent Application Publication (Laid-Open) No. 6-89601, at pages 3–7 and FIGS. 1–14. In recent years, the use of a semiconductor light emitting device in the vehicular headlamp has been discussed.

In order to obtain sufficient light amount in the vehicular headlamp, a method has been discussed in which a plurality of semiconductor light emitting devices are used. In this case, however, optical design may become more complicated, resulting in difficulty in formation of an appropriate light distribution pattern.

SUMMARY OF THE INVENTION

Therefore, it is an object of the present invention to provide a vehicular headlamp, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a vehicular headlamp for emitting light toward a predetermined emitting direction, comprises: a plurality of semiconductor light emitting devices that are substantially aligned by aligning their one sides with a predetermined straight line; and an optical component, having an optical center on the predetermined straight line, operable to irradiate light emitted by the plurality of semiconductor light emitting devices toward the emitting direction.

The vehicular headlamp may emit the light ahead of an automobile, for example, the plurality of semiconductor light emitting devices may be aligned in an substantially left-right direction of the automobile by aligning the sides with the straight line that extends in the substantially left-right direction of the automobile, and the optical component may form at least a part of a cut line that defines a boundary between a bright region and a dark region in a light distribution pattern of the vehicular headlamp based on the light emitted by the semiconductor light emitting devices from portions near the sides aligned with the straight line.

The vehicular headlamp may further comprise an attachment member having a straight side, wherein each of the plurality of semiconductor light emitting devices has a locking portion provided at a position away from a corresponding one of the sides to be aligned with the straight line by a predetermined distance, for indicating a reference position of the semiconductor light emitting device, and is attached by locking the locking portion to the straight side of the attachment member.

The vehicular headlamp may further comprise a locking member operable to lock each of the sides of the plurality of semiconductor light emitting devices.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

For example, the vehicular headlamp to which the present invention is applied, may include, but not limited to, regular headlamp, fog lamp and cornering lamp for automobiles, trains, motorcycles or the like.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
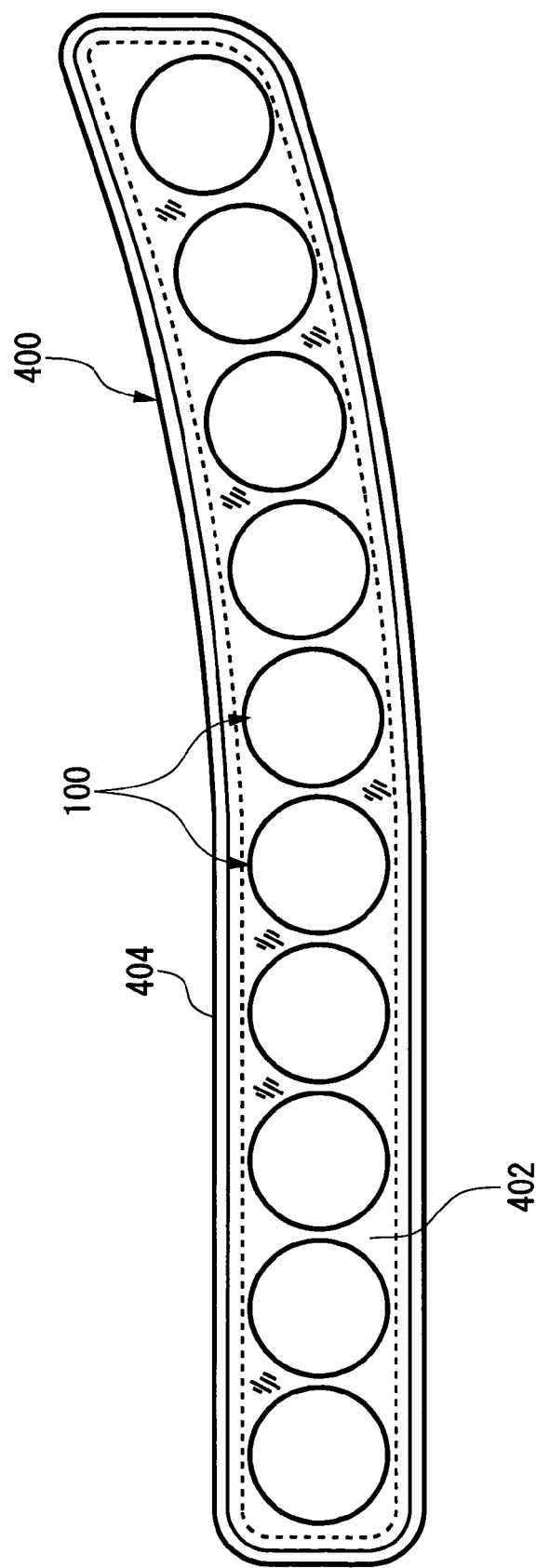
FIG. 1 illustrates an exemplary structure of au automotive lamp according to the present invention.

FIG. 1 illustrates an exemplary structure of an automotive lamp 400 as an example of the vehicular lamp according to an embodiment of the present invention. The automotive lamp 400 is a vehicular headlamp for emitting a low beam that emits light toward a predetermined emitting direction ahead of an automobile. The automotive lamp 400 of this example aims to clearly form a cut line that defines a boundary between a bright region and a dark region in a light distribution pattern of the vehicular headlamp. The automotive lamp 400 accommodates a plurality of light source units 100 substantially aligned in a row within a lamp chamber formed by a transparent cover 402 and a lamp body 404.

Those light source units 100 have the same or similar structure. The light source units 100 are accommodated in the lamp chamber in such a manner those optical axes are at a downward angle of about 0.3° to about 0.6° with respect to the front-rear direction (or lengthwise direction) of the automobile when the automotive lamp 400 is mounted on the body of the automobile. The automotive lamp 400 forms a predetermined light distribution pattern by emitting light ahead of the automobile based on the light emitted by those light source units 100. The automotive lamp 400 may include a plurality of light source units 100 respectively having different light distribution characteristics.

Figure 2:
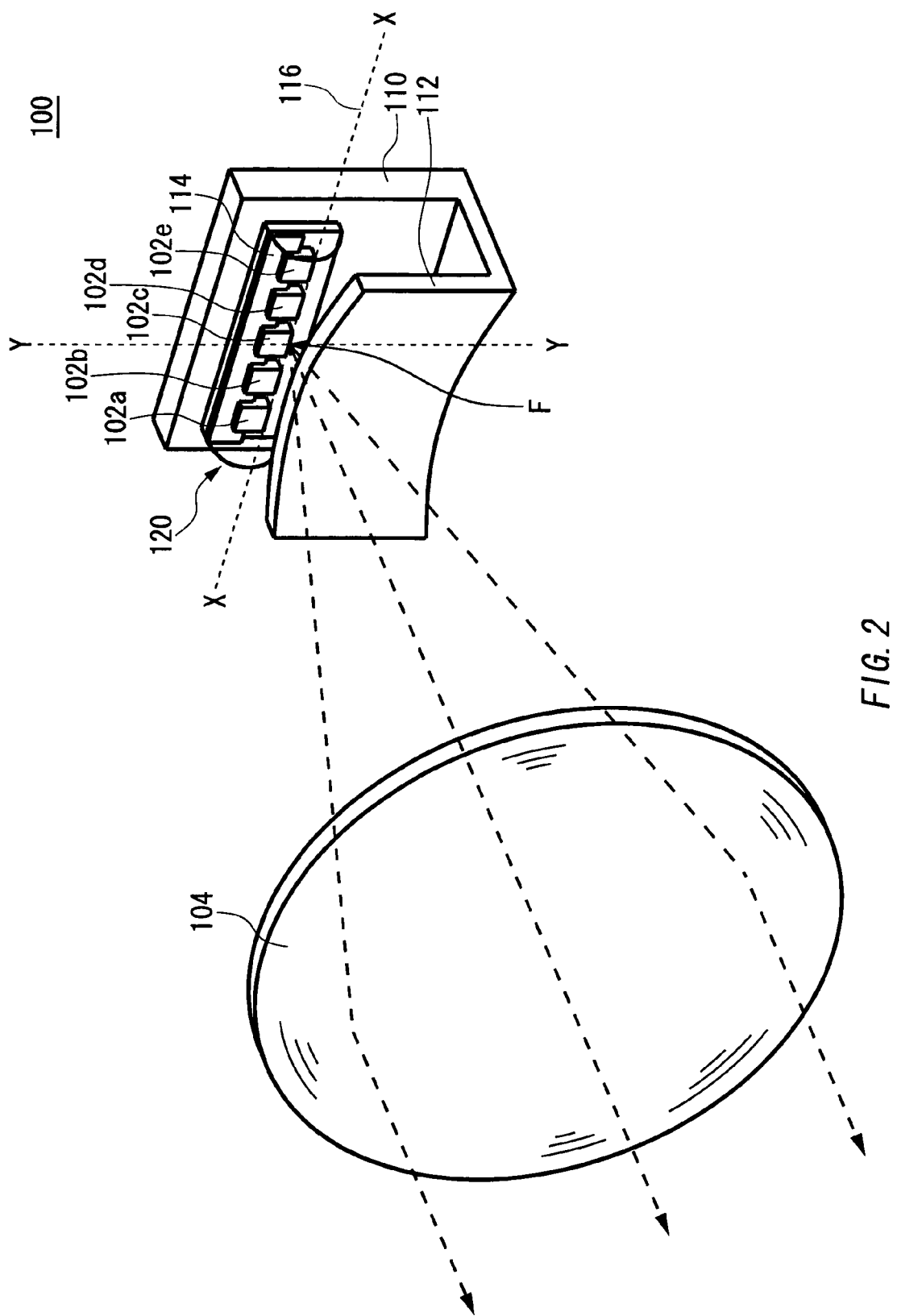
FIG. 2 is a perspective view of an exemplary light source.
Figure 3:
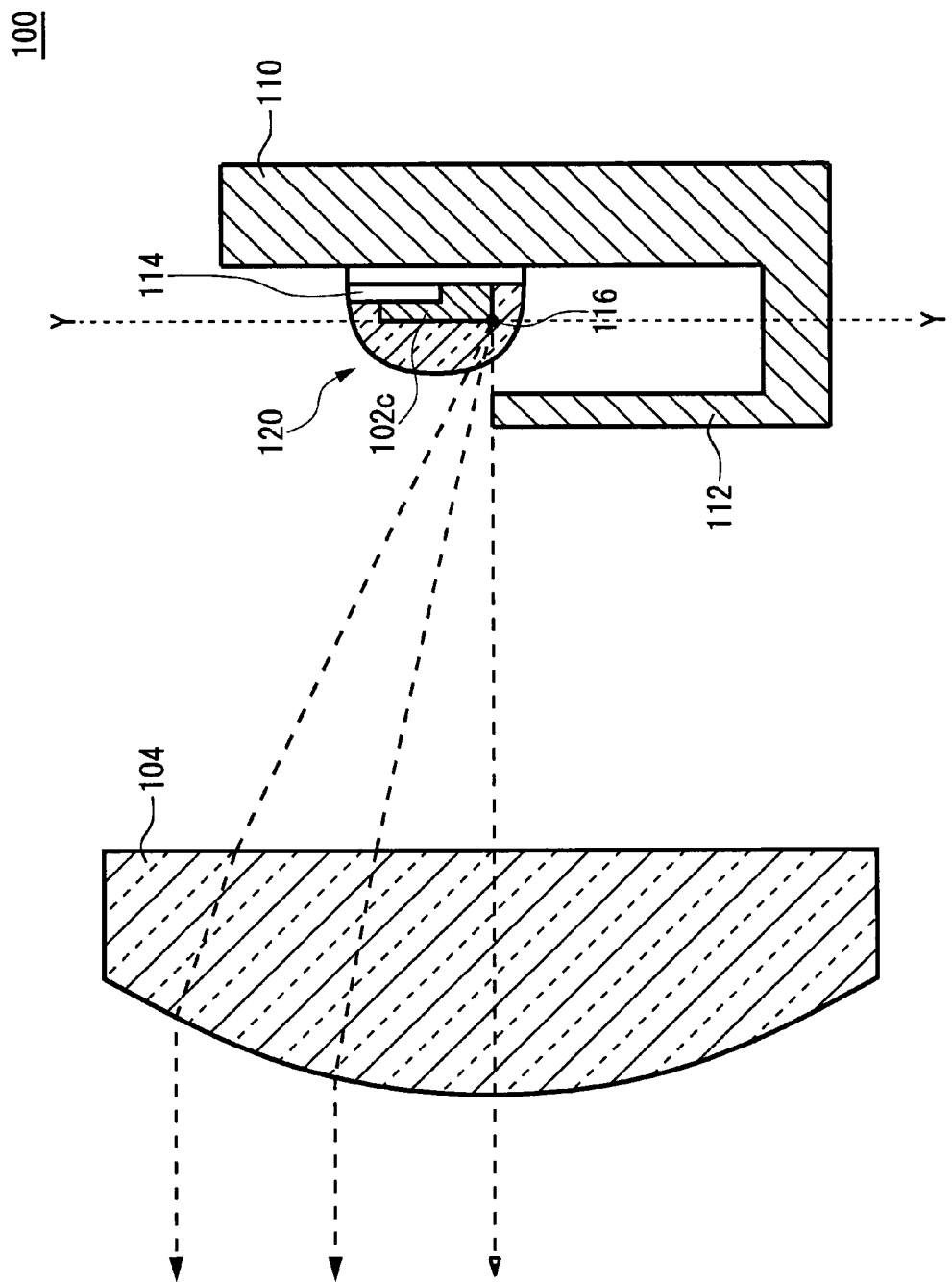
FIG. 3 is a cross-sectional view of the light source shown in FIG. 2.

FIGS. 2 and 3 illustrate an exemplary structure of the light source unit 100. FIG. 2 is a perspective view of the light source unit 100, while FIG. 3 is a cross-sectional view thereof cut along a vertical plane parallel to the front-rear direction of the automobile. The light source unit 100 of this example is a projector-type light source unit for emitting light generated by a light source 120 ahead by means of a lens 104, and includes a supporting member 110, a light blocking member 112, the light source 120 and the lens 104.

The supporting member 110 is a plate-like member that supports the bottom surface of the light source 120 on its surface facing ahead of the automobile so as to fix the light source 120, so that the light source 120 is allowed to emit light ahead of the automobile. In this example, the supporting member 110 is arranged to stand vertically. Thus, the supporting member 110 has a function of a heat sink that radiates heat generated by the light source 120. In this manner, it is possible to prevent reduction of light intensity of the light source 120 caused by the generated heat.

The light blocking member 112 is a plate-like member provided to be opposed to the surface of the supporting member 110 with a part of the light source 120 sandwiched therebetween, and blocks a part of light generated by the light source 120 by covering the part of the light source 120 from the automobile-front side of the light source 120, that is a closer side to the front of the automobile.

In this example, the light blocking member 112 blocks a part of the light generated by the light source 120 at its upper edge, thereby defining a boundary between a bright region and a dark region of light incident on the lens 104 based on the shape of the upper edge projected straight ahead of the upper edge. That projected shape of the upper edge is in form of a straight line extending in the substantially left-right direction of the automobile. That projected shape may be a shape with both ends turned down. In this example, the shape of the light blocking member 112 seen from above is such a shape that the light blocking member 112 crosses the light source unit 100 along the substantially left-right direction of the automobile while being curved backward at its center.

In this example, the lower end of the light blocking member 112 is connected to the lower end of the supporting member 110, as shown in FIG. 2, and they are formed integrally with each other. Therefore, the light blocking member 112 receives heat generated by the light source 120 from the supporting member 110. In this manner, the light blocking member 112 has a function of a heat sink for radiating that heat.

The light source 120 includes an attachment member 114 and a plurality of semiconductor light emitting devices 102a–102e substantially aligned by the attachment member 114. The semiconductor light emitting devices 102a–102e may be arranged in the substantially transverse direction of the automobile by aligning sides at the lower end thereof with a virtual straight line 116 that extends in the substantially left-right direction of the automobile substantially along the upper edge of the light blocking member 112.

The lens 104 is an exemplary optical component provided commonly to a plurality of semiconductor light emitting devices 102a–102e. The lens 104 is arranged on the automotive-front side of the semiconductor light emitting devices 102a–102e, and transmits light emitted by those semiconductor light emitting devices 102a–102e, thereby irradiating that light toward the emitting direction ahead of the automobile.

The lens 104 has an optical center F, that is a focus, a reference point in optical design or the like, on the straight line 116. In this example, the lens 104 has the optical center F on the intersection of X-axis extending on the straight line 116 in substantially the left-right direction of the automobile and Y-axis that passes through the center of one side at the lower end of the semiconductor light emitting device 102c and extends vertically. In this case, the lens 104 projects a clear boundary between a bright region and a dark region that corresponds to the straight line 116 ahead. The lens 104 forms at least a part of a cut line in a light distribution pattern of the automotive lamp 400 (see FIG. 1) based on light emitted from portions of the semiconductor light emitting devices 102a–102e near the sides at the lower ends thereof aligned with the straight line 116, for example. According to this example, the automotive lamp 400 can form the clear cut line.

The lens 104 may have its optical center F in a predetermined area on the straight line 116 that is determined to correspond to the precision required for formation of the cut line. For example, the lens 104 may have its optical center F on a position near the upper edge of the light blocking member 112, that is positioned substantially on the straight line 116.

Figure 4:
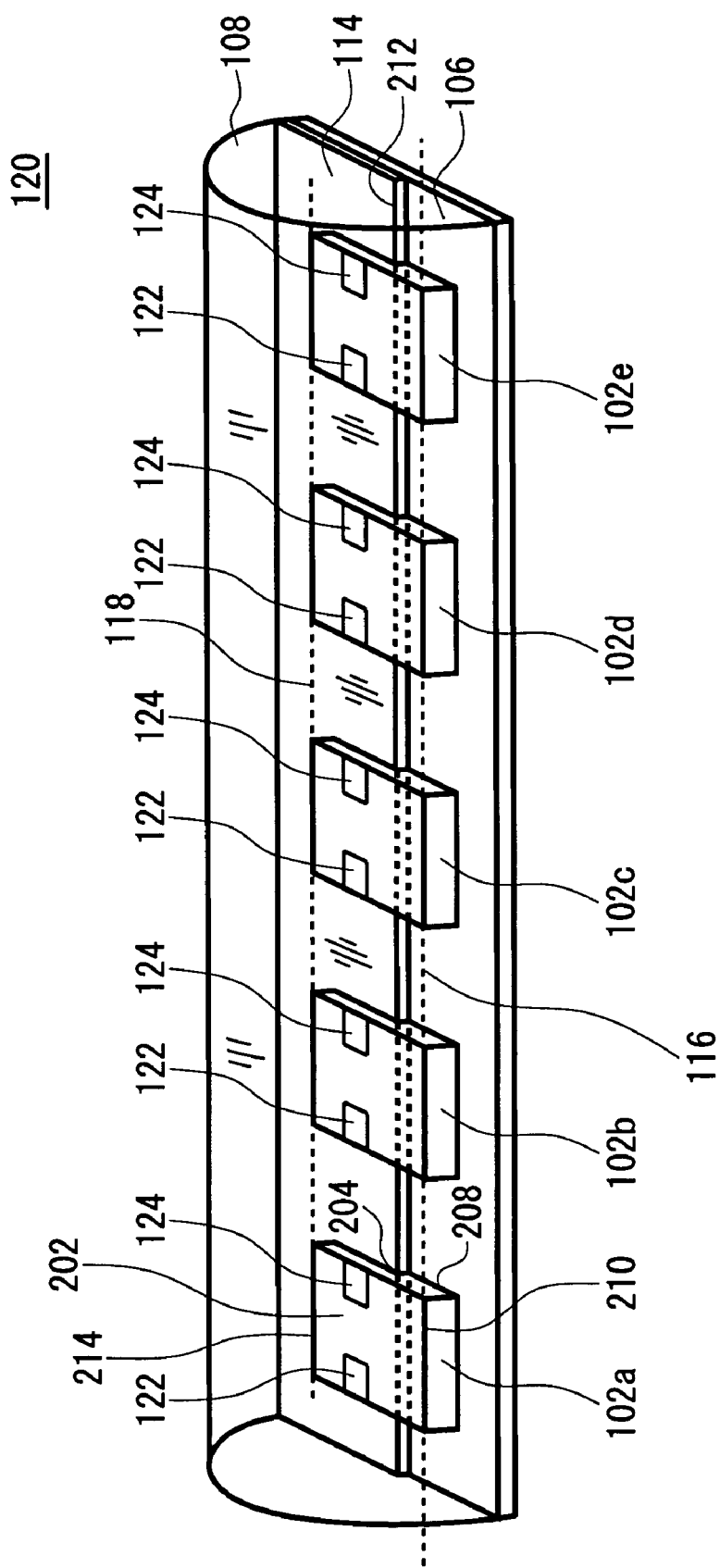
FIG. 4 is a perspective view of an exemplary light source.
Figure 5:
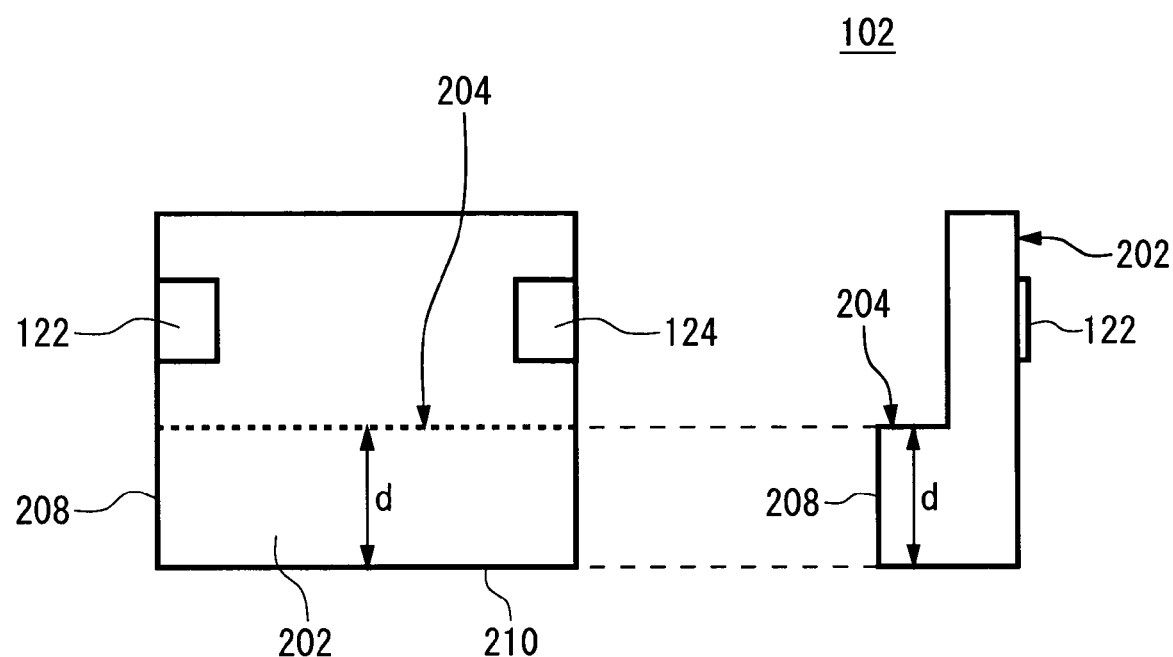
FIG. 5 is top and side views of a semiconductor light emitting device.

FIGS. 4 and 5 illustrate the structure of an exemplary light source 120 in detail. FIG. 4 is a perspective view of the light source 120, while FIGS. 5 is top and side views of the semiconductor light emitting device 102 included in the light source 120. The light source 120 of this example is a linear light source that extends in the substantially left-right direction of the automobile and includes a plurality of semiconductor light emitting devices 102a–102e, a substrate 106, a light transmitting member 108 and an attachment member 114. In this example, the light source 120 is attached to the supporting member 110 (see FIG. 2) in such a manner that the side 210 of each semiconductor light emitting device 102, extending in the direction in which the semiconductor light emitting devices 102a–102e are aligned, is positioned at the lower end of that semiconductor light emitting device 102.

Alternatively, the light source 102 may be attached to the supporting member 110 in such a manner that the aforementioned side 210 is positioned at the upper end of the semiconductor light emitting device 102. In this case, it is preferable that the lens 104 (see FIG. 2) have its optical center F (see FIG. 2) on a virtual straight line 118 on the surface 202 of the semiconductor light emitting device 102, which contains a side 214 that is an opposite side to the side 210.

A plurality of semiconductor light emitting devices 102a–102e are light emitting diodes, for example, and are substantially aligned in a predetermined aligning direction at approximately constant intervals on the substrate 106. Each of the semiconductor light emitting devices 102a–102e irradiates phosphors (not shown) provided on its surface with ultraviolet light so as to cause the phosphors to generate white light, for example. Alternatively, the semiconductor light emitting device may irradiate the phosphors with blue light so as to cause the phosphors to emit yellow light that is light of a complementary color of blue. In this case, the light source 120 emits white light based on the blue light and the yellow light respectively emitted by the semiconductor light emitting device and the phosphors.

In this example, each of a plurality of semiconductor light emitting devices 102a–102e has a positive electrode 122 and a negative electrode 124 on its surface. The positive electrode 122 and the negative electrode 124 are provided to correspond to a P-type semiconductor layer and an N-type semiconductor layer (both not shown) in the semiconductor light emitting device 102, respectively, and receive power for generating light. The positive electrode 122 and the negative electrode 124 may be provided near a side substantially perpendicular to the aligning direction in which a plurality of semiconductor light emitting devices 102a–102e are arranged. In this case, the effect of the shape of the positive electrode 122 or negative electrode 124 on the formation of the cut line can be reduced.

Moreover, a plurality of semiconductor light emitting devices 102a–102e may be electrically connected in series by wirings (not shown) provided in the light source 120. In this case, the current flowing through the semiconductor light emitting devices 102a–102e can be made uniform. Alternatively, the semiconductor light emitting devices 102a–102e may be electrically connected in parallel. In this case, the voltage to be supplied to the light source can be reduced.

The substrate 106 fixes the semiconductor light emitting devices 102a–102e and the attachment member 114 that are placed on its upper surface. The light transmitting member 108 is formed from material that can transmit light emitted by the semiconductor light emitting device 102, such as transparent resin, and seals a plurality of semiconductor light emitting devices 102a–102e by being formed to be opposed to the substrate 106 with those semiconductor light emitting devices 102a–102e and the attachment member 114 sandwiched therebetween.

The attachment member 114 is a plate-like member having a straight side 212. The side 212 is substantially parallel to the virtual straight line 116 containing the optical center F of the lens 104 and is used for defining positions at which a plurality of semiconductor light emitting devices 102a–102e are to be attached, respectively.

The semiconductor light emitting devices 102a–102e are described in more detail, below. As shown in FIG. 5, each of the semiconductor light emitting devices 102a–102e has a locking portion 204 provided at a position away from the side 210 by a predetermined distance d, for indicating a reference position of that semiconductor light emitting device. The side 210 is a side to be aligned with the straight line 116.

The semiconductor light emitting devices 102a–102e are attached by locking the locking portions 204 thereof to the side 212 of the attachment member 114, respectively. In this manner, a plurality of semiconductor light emitting devices 102a–102e are arranged with their sides 210 precisely aligned with the straight line 116. Thus, according to this example, it is possible to attach a plurality of semiconductor light emitting devices 102a–102e with high precision. Moreover, this allows the automotive lamp 400 (see FIG. 1) to form the clear cut line.

In this example, the locking portion 204 is a step in which a boundary between a higher portion and a lower portion is substantially parallel to the side 210, and is formed by a projection 208 provided on the back surface of the semiconductor light emitting device 102. In addition, the position away from the side 210 by the distance d, at which the locking portion 204 is to be provided, is a position away from the side face of the semiconductor light emitting device 102 containing the side 210 by the distance d, as shown in FIG. 5.

The protrusion 208 of the semiconductor light emitting device 102 is formed by etching a region of the back surface of the semiconductor light emitting device 102 other than the region in which the protrusion 208 is to be formed. In this case, the locking portion 204 can be formed with high precision. Therefore, it is possible to attach a plurality of light emitting devices 102a–102e with high precision.

Alternatively, the protrusion 208 may be formed by deposition of metal on the back surface of the semiconductor light emitting device 102 or by bonding a member of other semiconductor material on the back surface of the semiconductor light emitting device 102. In these cases, it is also possible to form the locking portion 204 with high precision.

Figure 6:
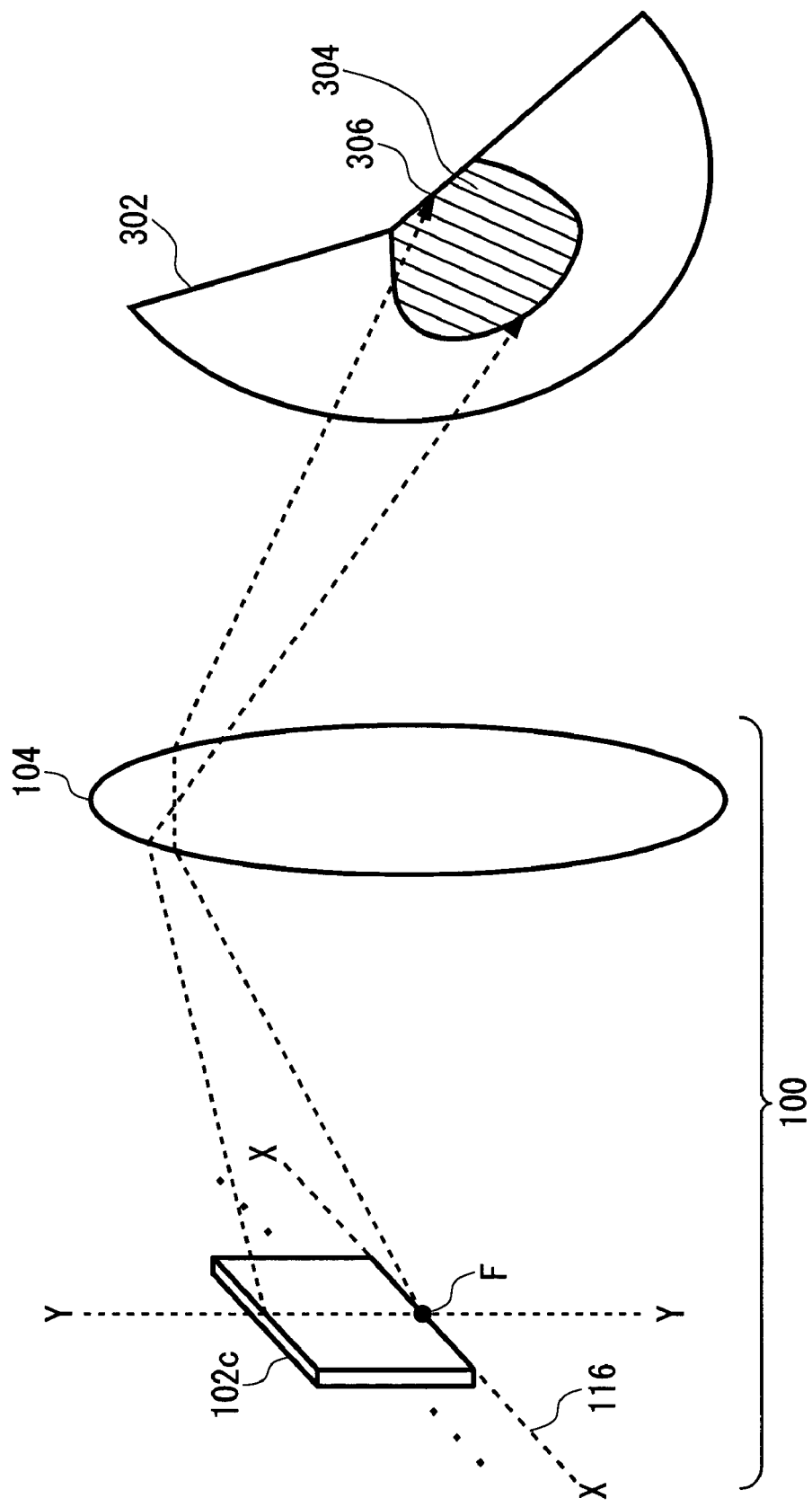
FIG. 6 is a conceptual diagram of an exemplary light distribution pattern.

FIG. 6 is a conceptual diagram of an exemplary light distribution pattern 302 formed by the light source unit 100. The light distribution pattern 302 is a light distribution pattern of a low beam formed on a virtual vertical screen arranged at a position 25 meters ahead of the light source unit 100.

According to this example, the lens 104 forms the light distribution pattern 302 having a predetermined shape by projecting light emitted by a plurality of semiconductor light emitting devices 102a–102e (see FIG. 2) onto the virtual vertical screen. The lens 104 forms a cut line in the light distribution pattern 302 based on the shape of the upper edge of the light blocking member 112 (see FIG. 2). For example, the lens 104 irradiates light emitted by the semiconductor light emitting device 102c to a region 304 that is a part of the light distribution pattern 302. In this case, the lens 104 may form a boundary 306 of the region 304 on the cut line in the light distribution pattern 302 in accordance with the side at the lower end of the semiconductor light emitting device 102c that is placed on the virtual straight line 116 to be aligned with the line 116.

As described referring to FIG. 2, the lens 104 has its optical center F on the straight line 116. In this case, the lens 104 clearly projects the boundary 306 to a region near the hot zone around the center of the light distribution pattern 302. Thus, it is possible to clearly form the cut line of the light distribution pattern 302.

The lens 104 may form a portion of the cut line in the light distribution pattern 302, other than the boundary 306, in accordance with the sides at the lower ends of the semiconductor light emitting devices 102a, 102b, 102d and 102e, for example. In this case, it is possible to clearly form the cut line in the light distribution pattern 302 because those sides are positioned in a focal plane of the lens 104.

In an alternative example, the automotive lamp 400 (see FIG. 1) may form the light distribution pattern 302 based on light generated by a plurality of light source units 100 respectively having different light distribution characteristics. In this case, each of those light source units 100 may irradiate a region that is a part of the light distribution pattern 302 with light.

Figure 7:
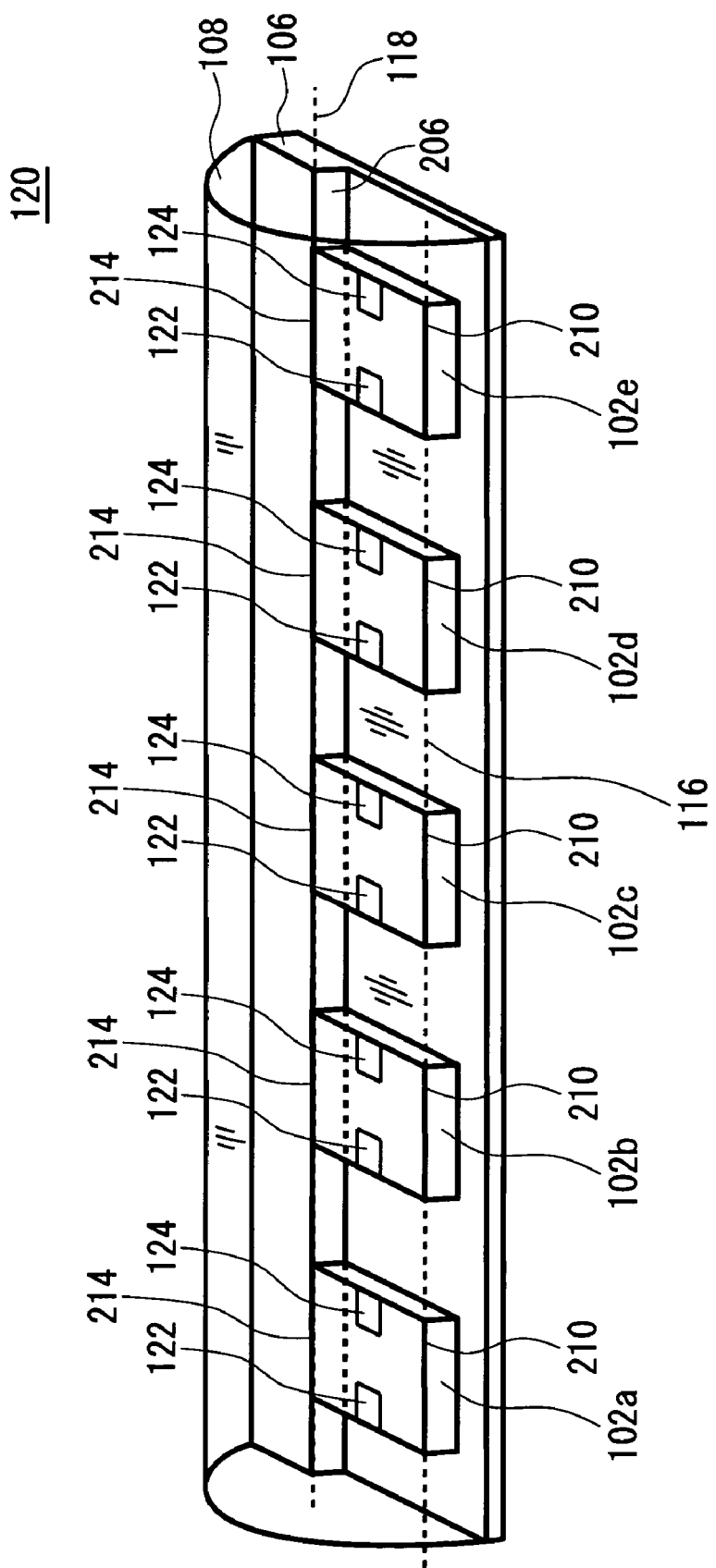
FIG. 7 illustrates the detailed structure of another exemplary light source.

FIG. 7 illustrates details of the structure of another exemplary light source 120. In this example, the substrate 106 is used as a locking member for locking a plurality of semiconductor light emitting devices 102a–102e. The substrate 106 has a locking portion 206 on its upper surface, which protrudes in a direction perpendicular to the upper surface of the substrate 106 and locks one side of each of the semiconductor light emitting devices 102a–102e at the locking portion 206.

Also in this example, the semiconductor light emitting devices 102a–102e are arranged in such a manner that one sides 210 thereof are aligned with the virtual straight line 116. Therefore, according to this example, it is possible to attach a plurality of semiconductor light emitting devices 102a–102e with high precision. Moreover, this allows the automotive lamp 400 (see FIG. 1) to form the clear cut line. Except for the above, the components in FIG. 7 labeled with the same reference numerals as those in FIG. 4 have the same or similar functions as/to the components in FIG. 4 and therefore the description thereof is omitted.

Figure 8:
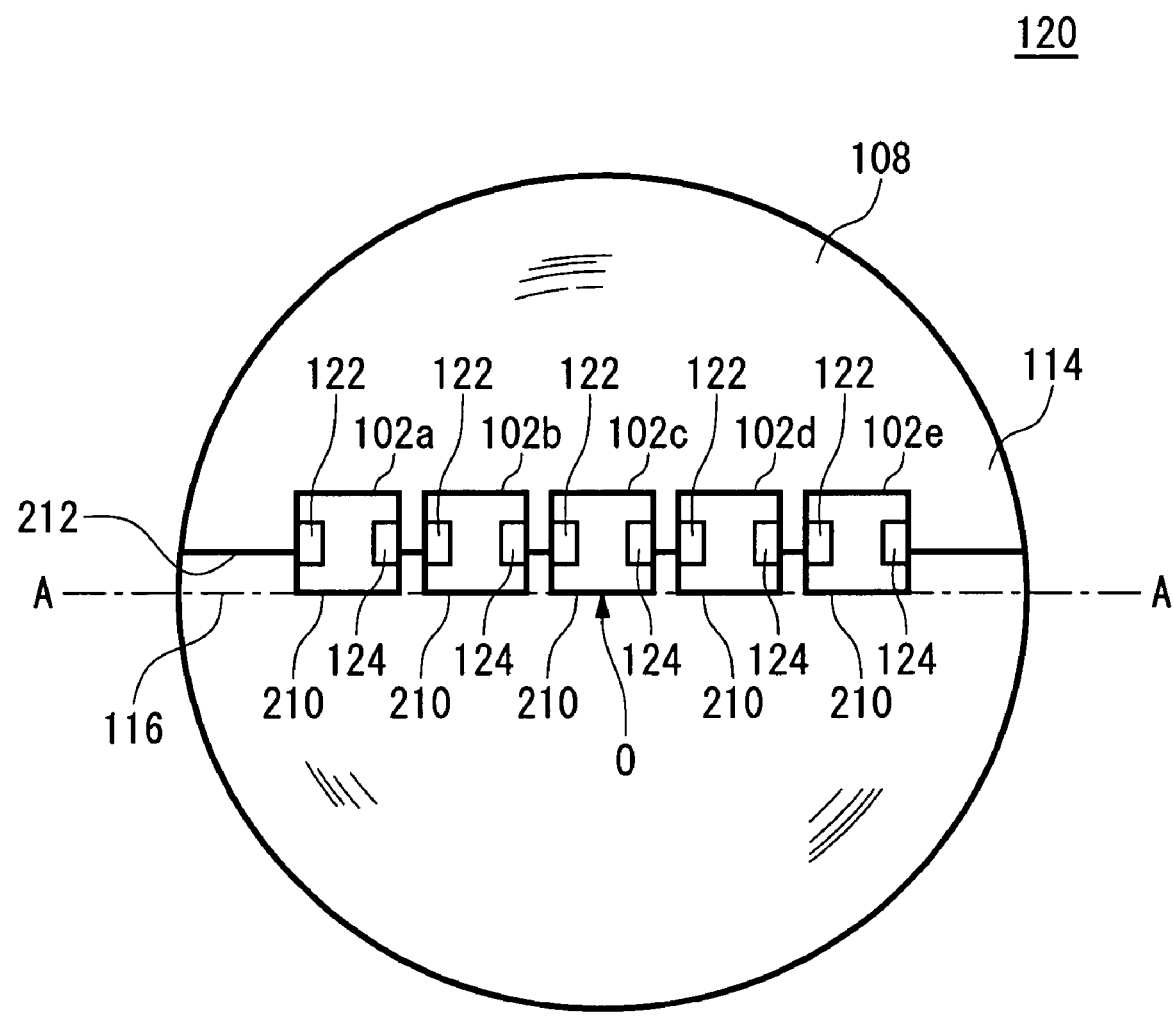
FIG. 8 is a top view of still another exemplary light source.
Figure 9:
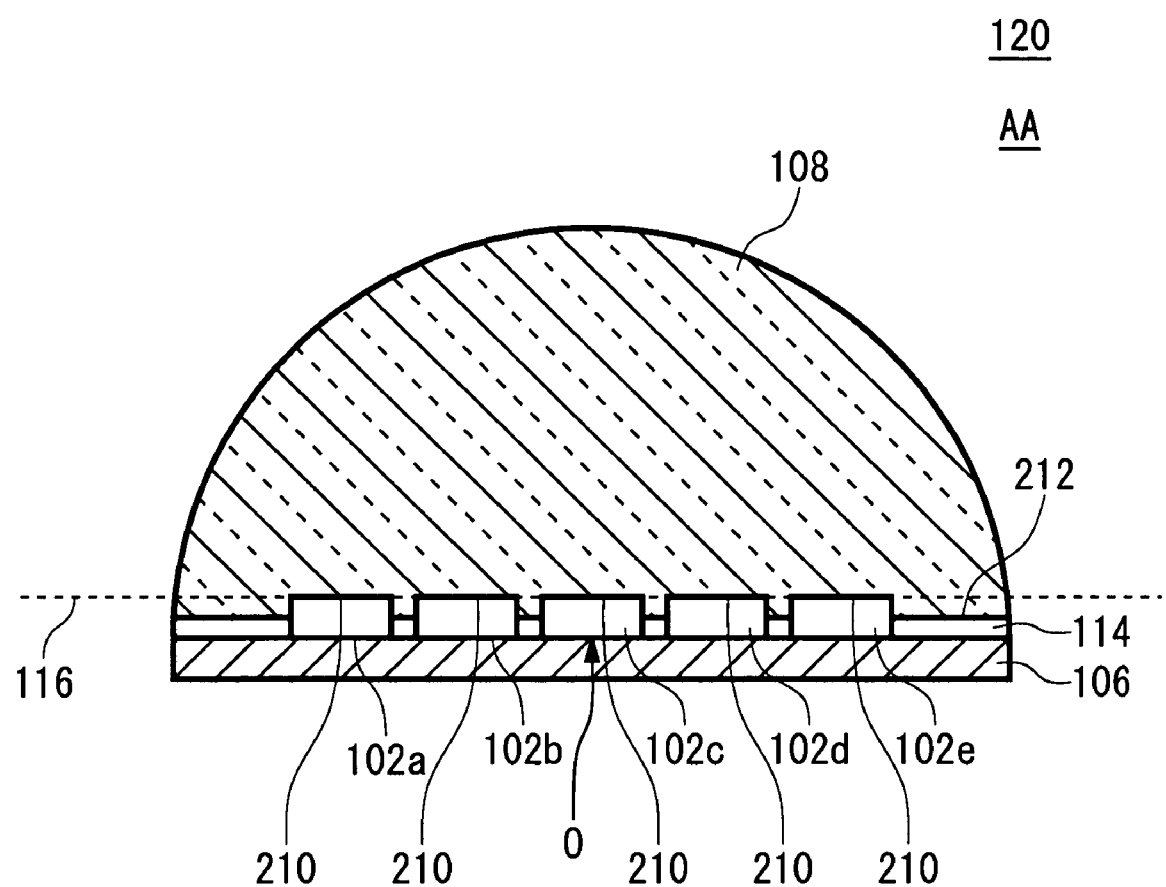
FIG. 9 is a cross-sectional view of the light source shown in FIG. 8.

FIGS. 8 and 9 illustrate details of the structure of still another exemplary light source 120. FIG. 8 is a top view of the light source 120, while FIG. 9 is a cross-sectional view thereof taken along line A—A in FIG. 8. In this example, the semiconductor light emitting devices 102a–102e have the same or similar functions as those described referring to FIG. 5.

In this example, the substrate 106 is a disc-like substrate. The attachment member 114 has a side 212 that is provided away from the virtual straight line 116 containing a diameter of a circle formed by the circumference of the upper surface of the substrate 106 to be parallel to the straight line 116. The attachment member 114 locks the locking portions 204 (see FIG. 5) of the semiconductor light emitting devices 102a–102e at the side 212. In this manner, the attachment member 114 holds the sides 210 of the semiconductor light emitting devices 102a–102e at positions where the sides 210 are aligned with the straight line 116. In this case, it is also possible to attach a plurality of semiconductor light emitting devices 102a–102e with high precision. The semiconductor light emitting devices 102a–102e are substantially aligned with their sides 210 aligned with respect to the straight line 116.

The light transmitting member 108 has an approximately hemispherical shape having its center at the center O of the aforementioned circle. The side 210 of one of the semiconductor light emitting devices 102a–102e positioned at the center of them, i.e., the semiconductor light emitting device 102c is placed on the center O of the aforementioned circle. In this case, the semiconductor light emitting device 102c irradiates light from a portion near the side 210 at such an angle with respect to the surface of the light transmitting member 108 that total reflection of that light does not occur. Therefore, the light transmitting member 108 can irradiate the light emitted by the semiconductor light emitting device 102 to the outside efficiently. Except for the above, the components in FIGS. 8 and 9 having the same reference numerals as those in FIG. 4 have the same or similar functions as/to the components in FIG. 4 and therefore the description thereof is omitted.

In an alternative example, the substrate 106 may have the locking portion 206 as is the case with the substrate 106 described referring to FIG. 7. In this case, it is possible to precisely attach the semiconductor light emitting devices 102a–102e without the attachment member 114.

Figure 10:
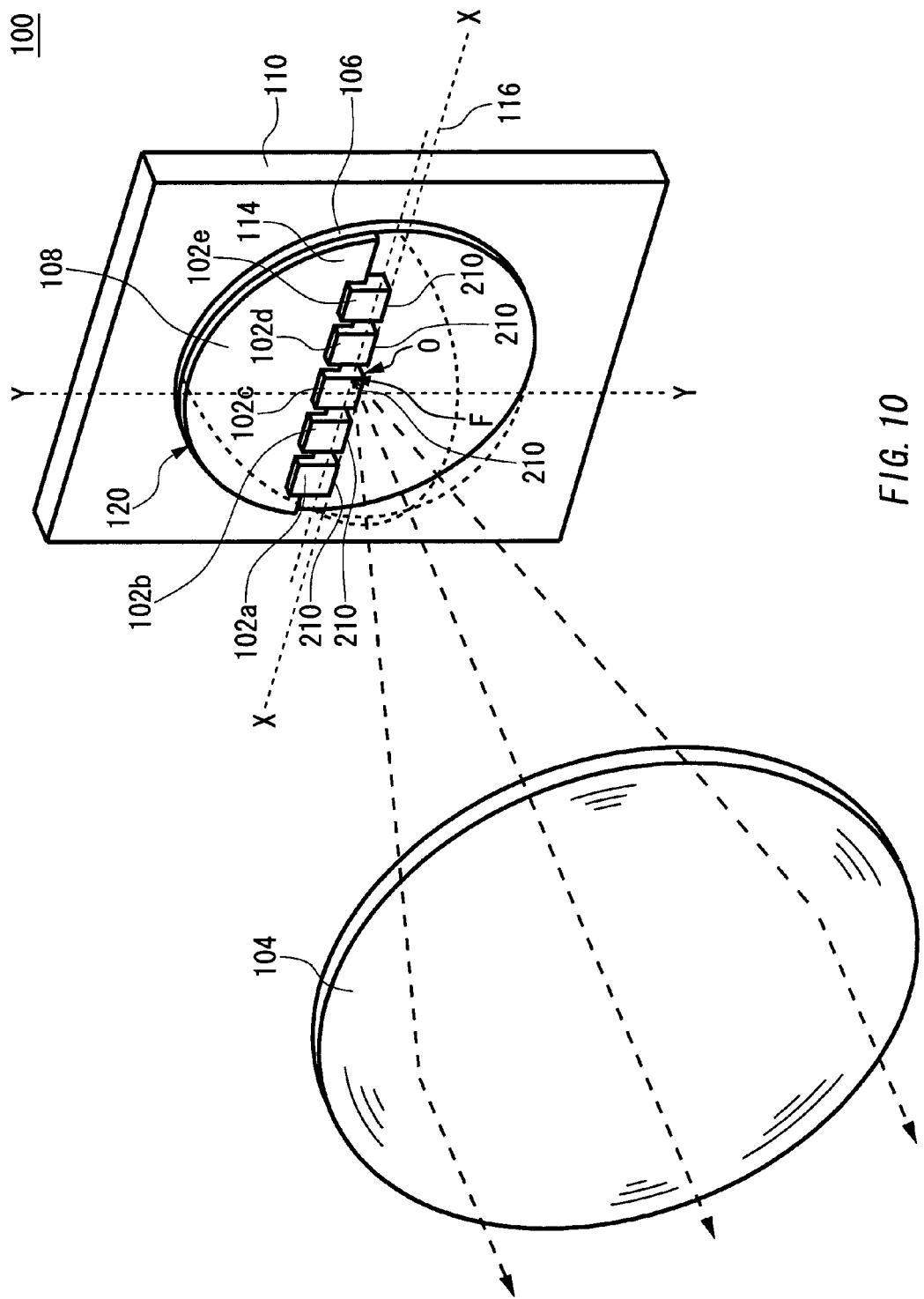
FIG. 10 is a perspective view of another exemplary light source unit.
Figure 11:
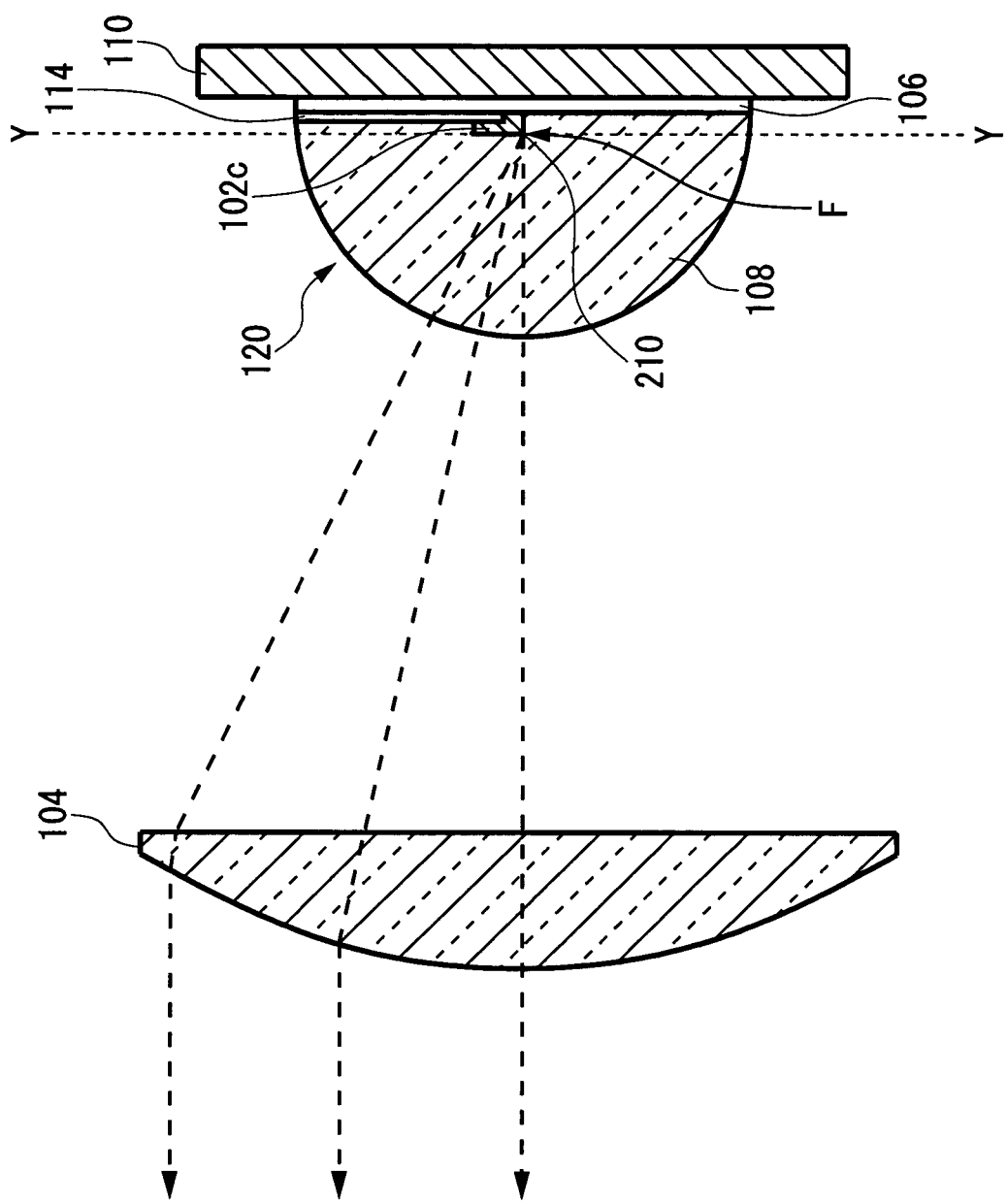
FIG. 11 is a cross-sectional view of the light source unit shown in FIG. 10.

FIGS. 10 and 11 illustrate the structure of another exemplary light source unit 100. FIG. 10 is a perspective view of the light source unit 100, while FIG. 11 is a cross-sectional view thereof taken along a vertical place parallel to the front-rear direction of the automobile. In this example, the light source unit 100 makes light emitted by a plurality of semiconductor light emitting devices 102a–102e incident directly on the lens 104 without using the light blocking member 112 (see FIG. 2).

The light source 120 has the same or similar function as/to that shown in FIGS. 8 and 9. A plurality of semiconductor light emitting devices 102a–102e are fixed on the substrate 106 in such a manner their sides 210 aligned with the virtual line 116 are positioned at the lower ends. The light source 120 may have the same or similar function and structure as/to the light source 120 shown in FIG. 7.

The lens 104 has its optical center F on the side 210 of the semiconductor light emitting device 102c. In this example, the lens 104 has its optical center F on the intersection of X-axis extending on the straight line 116 in the left-right direction of the automobile and Y-axis passing through the center of the side at the lower end of the semiconductor light emitting device 102c and extending vertically. In this case, the lens 104 forms at least a part of the cut line in the light distribution pattern by projecting an image of a portion near that side 210.

The light source unit 100 of this example forms a light distribution pattern that is similar to at least a part of the light distribution pattern 302 shown in FIG. 6. The lens 104 irradiates light emitted by the semiconductor light emitting device 102c to a region 304 that is a part of the light distribution pattern 302. In this case, the lens 104 forms a boundary 306 of the region 304 on the cut line in the light distribution pattern 302 in accordance with the side 210 of the semiconductor light emitting device 102c. The lens 104 may form the boundary 306 by projecting the light emitted from an end face of the semiconductor light emitting device 102c which contains the side 210.

According to this example, it is possible to form an appropriate light distribution pattern. The automotive lamp 400 (see FIG. 1) may form the light distribution pattern 302 based on light generated by a plurality of light source units 100 respectively having different light distribution characteristics. Except for the above, the components in FIGS. 10 and 11 labeled with the same reference numerals as those in FIGS. 2 and 3 have the same or similar functions as the components in FIGS. 2 and 3 and therefore the description thereof is omitted.

Figure 12:
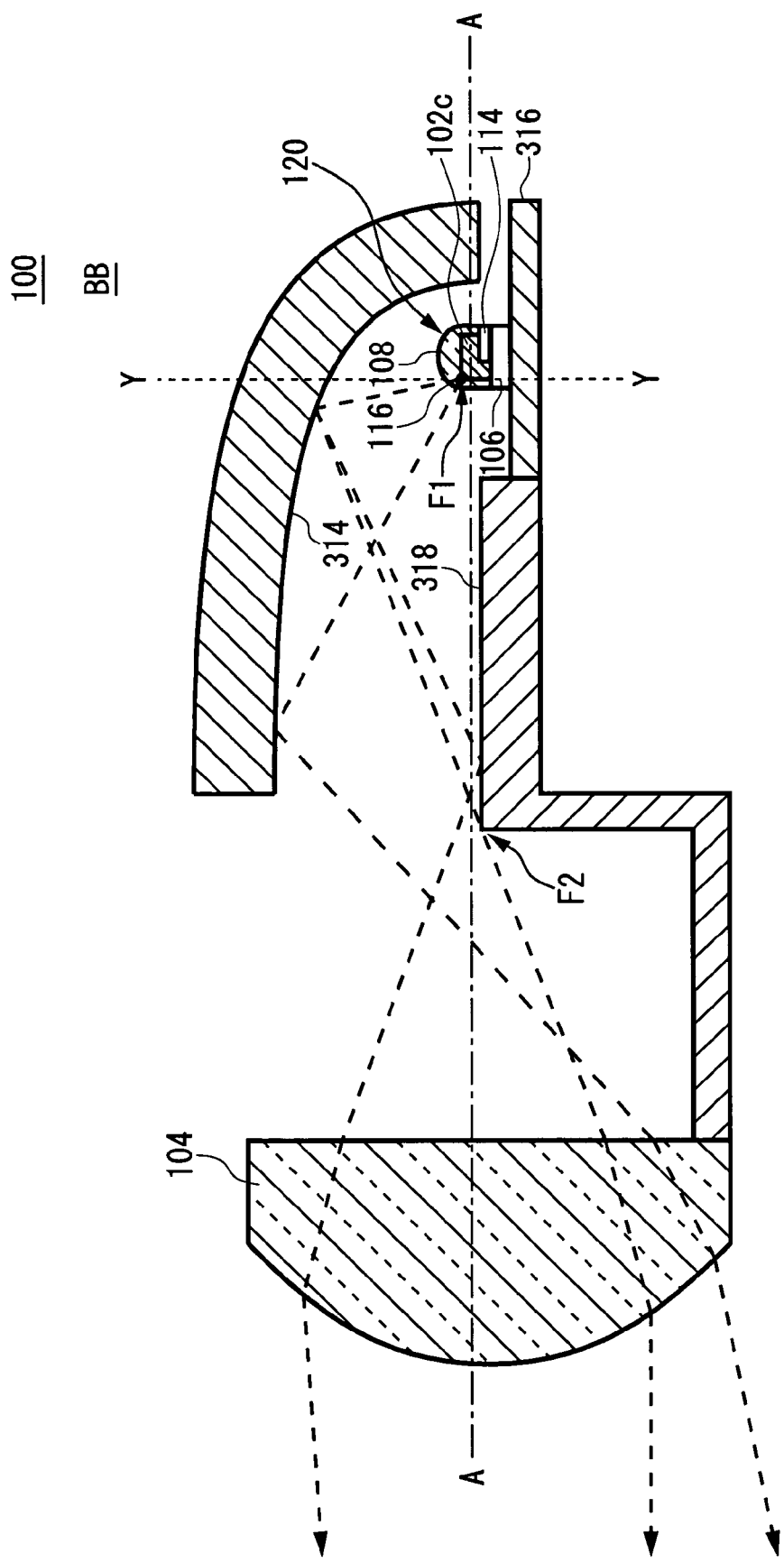
FIG. 12 is a cross-sectional view of another exemplary light source unit taken along a B—B vertical plane.
Figure 13:
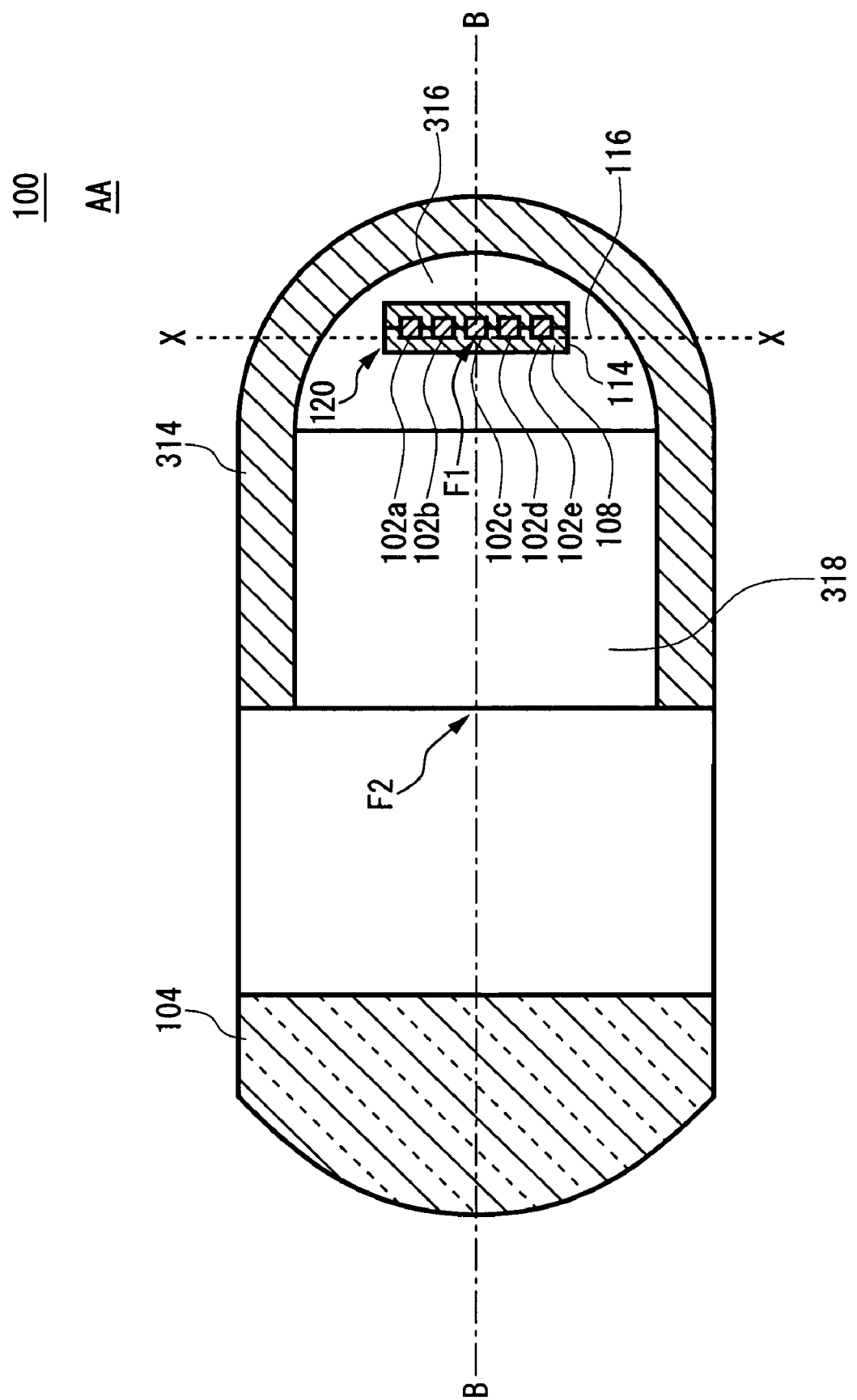
FIG. 13 is a cross-sectional view of the light source unit shown in FIG. 12, taken along an A—A horizontal plane.

FIGS. 12 and 13 illustrate the structure of another exemplary light source unit 100. FIGS. 12 and 13 are cross-sectional views of the light source unit 100 taken along a B—B vertical plane and an A—A horizontal plane, respectively. The light source unit 100 of this example is a projector-type light source unit that emits light reflected and converged at a position near the optical axis, ahead via a lens. The light source unit 100 includes a supporting member 316, a light source 120, a reflecting mirror 318, a lens 104 and another reflecting mirror 314.

The supporting member 116 is a plate-like member having an upper surface arranged substantially horizontally, and fixes the bottom surface of the light source 120 placed on the upper surface thereof. The light source 120 includes a plurality of semiconductor light emitting devices 102a–102e and is fixed on the upper surface of the supporting member 116 to face up. The light source 120 has the same or similar function as the light source 120 described referring to in FIG. 4 or 7. The semiconductor light emitting devices 102a–102e are substantially aligned by aligning the sides at front ends thereof with the virtual straight line 116 extending in the substantially left-right direction of the automobile. The light source 120 may have the same or similar function as the light source 120 shown in FIGS. 8 and 9.

The reflecting mirror 318 reflects light at its upper surface that is arranged substantially horizontally, and is provided between the front end of the supporting member 316 and the lens 104. The reflecting mirror 318 may be provided in a plane substantially containing a plurality of semiconductor light emitting devices 102a–102e. In this case, light generated by the light source 120 can be made incident on the lens 104 efficiently. Moreover, the front edge of the reflecting mirror 318 has a substantially straight shape that extends in the substantially left-right direction of the automobile. This front edge of the reflecting mirror 318 may have a shape in accordance with the cut line to be formed, such as a shape with both ends turned down.

The lens 104 is provided on the automobile-front side of the reflecting mirrors 318 and 314 and transmits light reflected by the reflecting mirror 318 or 314 to direct that light toward the emitting direction ahead of the automobile. In this example, the lens 104 has a focus near the front edge of the reflecting mirror 318 and forms at least a part of the light distribution pattern of the automotive lamp 400 (see FIG. 1) by projecting an image of a focal plane containing the focus of the lens 104 ahead of the automobile. In this case, the lens 104 forms at least a part of the cut line in the light distribution pattern of the automotive lamp 400 based on the shape of the front edge of the reflecting mirror 318.

The reflecting mirror 314 is an exemplary optical component provided commonly to a plurality of semiconductor light emitting diodes 102a–102e and is arranged to surround the light source 120 from behind, above and sides of the light source 120. In this manner, the reflecting mirror 314 reflects light generated by the light source 120 ahead, thereby making that light incident on the lens 104 and then making the lens 104 irradiate that light toward the emitting direction. Thus, the reflecting mirror 314 irradiates light emitted by a plurality of semiconductor light emitting devices 102a–102e toward the emitting direction.

In this example, at least a part of the reflecting mirror 314 has an approximately spheroidal shape formed by a combined elliptical plane, for example. This approximately spheroidal shape is set in such a manner that a cross section thereof containing the optical axis of the light source unit 100 forms at least a part of an approximately elliptical shape. The eccentricity of that approximately elliptical shape is set to gradually increase from that in the vertical cross section to that in the horizontal cross section. In addition, the light source unit 100 has the optical axis that runs approximately through the center of the lens 104 to go ahead of the automobile.

The approximately spheroidal part of the reflecting mirror 314 has a focus F1, that is an exemplary optical center, on the straight line 116 and a focus F2 near the front end of the reflecting mirror 318. In this example, that approximately spheroidal part has the focus F1 on the intersection of X-axis extending on the straight line 116 along the left-right direction of the automobile and Y-axis passing through the center of the side at the front end of the semiconductor light emitting device 102c and extending vertically. In this case, that approximately spheroidal part converges at least most of the light generated by the light source 120 at a position near the front edge of the reflecting mirror 318.

In this case, a clear boundary between a bright region and a dark region base on the shape of the front edge of the reflecting mirror 318 is formed near that front edge. Therefore, the lens 104 having its focus near that front edge of the reflecting mirror 318 can irradiate light having the clear boundary between the bright and dark regions to a region near the cut line in the light distribution pattern. Thus, according to this example, it is possible to appropriately form the light distribution pattern having the clear cut line.

Moreover, the approximately spheroidal part of the reflecting mirror 314 may have the optical center on the straight line 116 on which the front ends of the semiconductor light emitting devices 102a–102e are aligned and placed. In this case, that approximately spheroidal part makes at least most of the light emitted by the semiconductor light emitting devices 102a–102e incident directly on the lens 104 without making it incident on the reflecting mirror 318. Therefore, it is possible to irradiate the region near the cut line with light more appropriately.

Alternatively, the reflecting mirror 314 may be a parabolic reflecting mirror having its focus near the straight line 116. In this case, the light source unit 100 may be a parabolic light source unit that emits light ahead by using a parabolic reflecting mirror. Such a light source unit 100 has a transparent cover in place of the lens 104, for example. In this case, the light source unit 100 can emit light controlled with high precision ahead.

As is apparent from the above description, according to the present invention, it is possible to appropriately form a light distribution pattern.

Although the present invention has been described by way of exemplary embodiments, it should be understood that those skilled in the art might make many changes and substitutions without departing from the spirit and the scope of the present invention which is defined only by the appended claims.

What is claimed is:

1. A projector-type vehicular headlamp for emitting light via a lens toward a predetermined emitting direction, comprising:
   a plurality of semiconductor light emitting devices that are substantially aligned by aligning their one sides at an end thereof with a predetermined straight line; and
   an optical component, having a focus on said predetermined straight line, operable to irradiate light emitted by said plurality of semiconductor light emitting devices toward said emitting direction, wherein
   said vehicular headlamp emits said light ahead of an automobile, said plurality of semiconductor light emitting devices are aligned in an substantially left-right direction of the automobile by aligning said sides with said straight line that extends in said substantially left-right direction of the automobile, and said optical component forms at least a part of a cut line that defines a boundary between a bright region and a dark region in a light distribution pattern of said vehicular headlamp based on said light emitted by said semiconductor light emitting devices from portions near said sides aligned with said straight line.

2. A vehicular headlamp as claimed in claim 1, further comprising an attachment member having a straight side, wherein each of said plurality of semiconductor light emitting devices has a locking portion provided at a position away from a corresponding one of said sides to be aligned with said straight line by a predetermined distance, for indicating a reference position of said semiconductor light emitting device, and is attached by locking said locking portion to said straight side of said attachment member.

3. A vehicular headlamp as claimed in claim 1, further comprising a locking member operable to lock each of said sides of said plurality of semiconductor light emitting devices.

* * * * *